United States Patent [19]
Shoji et al.

[11] Patent Number: 6,133,614
[45] Date of Patent: *Oct. 17, 2000

[54] APPARATUS FOR DETECTING RADIATION AND METHOD FOR MANUFACTURING SUCH APPARATUS

[75] Inventors: Tatsumi Shoji, Hiratsuka; Keiichi Kawasaki, Tokyo; Isao Tanikawa, Hiratsuka; Kazuaki Tashiro, Hadano; Ichiro Tanaka, Atsugi; Tatsuya Yamazaki, Zushi, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/697,281

[22] Filed: Aug. 27, 1996

[30] Foreign Application Priority Data

Aug. 28, 1995 [JP] Japan .................................... 7-219308
Aug. 28, 1995 [JP] Japan .................................... 7-219309
Aug. 28, 1995 [JP] Japan .................................... 7-219310

[51] Int. Cl.$^7$ .......................... H01L 31/00; H01L 31/115; H01L 31/0232
[52] U.S. Cl. .......................... 257/443; 257/429; 257/436; 257/444; 250/484.4; 250/581
[58] Field of Search .............................. 250/581, 484.4; 257/428, 429, 436, 444, 443

[56] References Cited

U.S. PATENT DOCUMENTS

| | | | |
|---|---|---|---|
| 4,914,301 | 4/1990 | Akai | ........................................ 257/428 |
| 5,041,729 | 8/1991 | Takahashi et al. | ................. 250/370.11 |
| 5,187,369 | 2/1993 | Kingsley et al. | ................... 250/370.11 |
| 5,430,298 | 7/1995 | Possin et al. | ....................... 250/370.11 |

FOREIGN PATENT DOCUMENTS

| | | | |
|---|---|---|---|
| 53-96789 | 8/1978 | Japan | .............................. H01L 31/00 |
| 5-60871 | 3/1993 | Japan | .............................. G01T 1/20 |
| 7-111322 | 4/1995 | Japan | . |

OTHER PUBLICATIONS

European Search Report dated Sep. 22, 1998.

*Primary Examiner*—Ngân V. Ngô
*Attorney, Agent, or Firm*—Fitzpatrick, Cella, Harper & Scinto

[57] ABSTRACT

A method for manufacturing a semiconductor apparatus for detecting radiation provided with phosphor comprises the steps of forming a phosphor layer integrally with a meshed partition plate having partitions per pixel of the semiconductor apparatus for detecting radiation, and of separating the phosphor per pixel by removing the phosphor on the partitioning portion of the partition plate by the irradiation of laser beam in the form of grooves together with the surface layer of the partitioning portions in order to make the phosphor thick to obtain a higher sensitivity, and also to make pixel pitches finer to enhance resolution, thus obtaining exact images without creating any cross talks between pixels.

12 Claims, 9 Drawing Sheets

130 μm, 30 μm, 123, 117, 119

117, 123, 118, 119, 116

FLUORESCENT PLATE, 117, 120, 118, 119, 116

APPARATUS FOR DETECTING RADIATION AND METHOD FOR MANUFACTURING SUCH APPARATUS

BACKGROUND OF THE INVENTION

1. Field of the Invention

The present invention relates to an apparatus for detecting radiation and a method for manufacturing such apparatus. More particularly, the invention relates to an apparatus for detecting radiation using a semiconductor, such as amorphous silicon representing non-crystalline semiconductor, and relates to a method for manufacturing such an apparatus.

2. Related Background Art

There have been proposed various methods for detecting radiation by combining a photodetector and phosphor in various ways. Also, it is possible to obtain positional information or image information by dividing a photodetector into a plurality of pixels. In this case, if phosphor is arranged all over the pixels uniformly, not only does fluorescence enter a photodetector immediately beneath the phosphor, but also, unwanted fluorescence enters the photodetectors adjacent to the phosphor. This decreases the resolution of images.

In order to prevent decreased resolution; there have been proposed, for example, a preventive means as disclosed in Japanese Patent Laid-Open Application No. 53-96789 wherein partition plates are provided between photodetectors to prevent light from breaking through a particular photodetector, and phosphor is buried in each portion thus partitioned, and also, as disclosed in Japanese Patent Laid-Open Application No. 5-60871 wherein a substrate having a plurality of recessed portions is arranged, and phosphor is buried in each recessed portion to make it a radiation detector by adhesively bonding such substrate to a photodetecting panel having a plurality of pixels.

FIGS. 1 to 3 illustrate these examples. Now, for example, a structure is arranged as shown in FIG. 1 so that a fluorescent plate 6 is provided on the radiation incident side, and the incident radiation is transformed into visible light in the fluorescent plate 6, thus being converted into electric signals when it is incident upon a semiconductor photodetection element 2.

Also, as shown in FIG. 2, a structure is arranged so that a fluorescent plate 6 is divided and provided separately for each of the pixels on a semiconductor photodetector 2, and the incident radiation is transformed into visible light in the fluorescent plate 6 thus separated for each pixel, and that such light is converted into electric signals when it is incident upon each of the pixels of the semiconductor photodetection element 2.

Or, it is possible to cite a structure arranged as shown in FIG. 3. The structure is such that a fluorescent plate 6, which is divided into each of the pixels, is arranged on the side opposite to the incident side of radiation, and the incident radiation is directly converted into electric signals per pixel by means of the semiconductor fluorescent detection element 2. Further, the radiation having passed the semiconductor photodetection element 2 is transformed into visible light by means of the fluorescent plate 6 which is divided per pixel. The visible light is converted into electric signals when it is incident upon each of the pixels of the semiconductor photodetection element 2.

However, the method in which phosphor is buried in each portion separated by partition plates has a problem that any defects that may be found after the completion of the phosphor coating process, such as sensitivity unevenness and point defective of phosphor, tend to make the expensive photodetecting portion eventually defective.

Also, the method in which phosphor is buried in a substrate provided with a plurality of recessed portions for the formation of a radiation detector, which is adhesively bonded to a photodetecting panel having a plurality of pixels, often presents a problem that the substrate becomes weaker due to many numbers of recessed portions. As a result, damages is caused or its handling is made difficult in some cases. Also, it is necessary to make the aperture ratio greater particularly when improving its efficiency. In other words, the ratio of the size of recessed portion should be made larger. Such problems, as described above, are serious.

These radiation detectors also present a problem that the interface between phosphor and the recessed portions or partition plates is partially peeled off due to bending stress at the time of handling, hence causing the reflectance of light to vary at the recessed portions or partition plates per pixel. This generates image unevenness in some cases.

For the structures described above in conjunction with FIGS. 1 to 3, there are also aspects yet to be improved as given below.

In accordance with the structure shown in FIG. 1 that uses the phosphor having no pixel separation, when the incident radiation, which is transformed into visible light in the phosphor, is allowed to be incident upon adjacent pixels of a semiconductor element, so-called cross-talks between pixels results, thus making it impossible to obtain the exact image of a target image in some cases.

In accordance with the structure shown in FIG. 2, that uses the phosphor having separated pixels, it is possible to eliminate the cross talks referred to in the preceding paragraph, but there is no specific means for separation when making the pixel pitches finer to increase the resolution, and also, when making the thickness of phosphor larger in order to enhance the sensitivity. As a result, there is a limit to obtaining a higher resolution and sensitivity in some cases.

In accordance with the structure shown in FIG. 3, it is possible to anticipate some effect when a semiconductor photodetecting element formed by mono-crystalline semiconductor, but it is impossible to convert radiation into electric signals directly by means of an apparatus using amorphous semiconductor, such as a —Si semiconductor, formed on an insulated substrate as an apparatus for detecting radiation, which should be capable of dealing with an image having a large area. Therefore, it is still impossible to solve those problems as described above depending on the situation.

SUMMARY OF THE INVENTION

It is an object of the present invention to provide an apparatus for detecting radiation suitable for a large area and capable of obtaining exact-images without creating any cross talks between pixels, wherein pixel pitches are made finer to enhance resolution, and phosphor is made thicker for a higher sensitivity.

It is another object of the invention to provide an apparatus for detecting radiation, which is structured to be able to avoid making the expensive photodetection portion defective at the time of the completion of phosphor coating process that may result in the uneven sensitivity, point defects of phosphor or the like. A further object is to prevent the substrate from becoming weaker even if the aperture ratio is made greater so that the phosphor interface is not peeled off due to bending stress or the like at the time of handling, hence no unevenness is created in the images to be obtained.

It is still another object of the invention to provide an inexpensive apparatus for detecting radiation having a high sensitivity obtainable by the increased thickness of phosphor without causing any malfunction of TFT due to such thickness thereof, as well as a good throughput without lowering its yield, and also, to provide a method for manufacturing such apparatus.

It is a further object of the invention to provide a method for manufacturing a semiconductor apparatus for detecting radiation provided with a photodetection substrate having a plurality of pixels and phosphor, comprising the following steps of:

forming a phosphor layer integrally with a partition plate having apertures arranged for each of the pixels of the semiconductor apparatus; and separating the phosphor per pixel by removing the phosphor by the irradiation of laser beam in the form of grooves at least on the partitioned portions to form each aperture of the partition plate.

It is still a further object of the invention to provide a method for manufacturing an apparatus for detecting radiation, comprising the steps of:

adhesively bonding a plate for use of holding strength to one face of a partitioning member having apertures corresponding to a plurality of pixels arranged on a photodetection substrate;

producing a fluorescent plate by separately filling phosphor in the respective apertures; and adhesively bonding the fluorescent plate and the photodetection substrate.

Moreover, it is another object of the invention to provide a semiconductor apparatus for detecting radiation having phosphor and a photodetection substrate provided with a plurality of photodetection elements, wherein each of the pixels of the photodetection substrate is provided with phosphor separated per pixel by the separating portions formed on the partitioning member and the grooves on the partitioning portions of the partitioning member arranged for the phosphor.

It is still another object of the invention to provide an apparatus for detecting radiation formed by the combination of a fluorescent plate and a photodetection substrate, wherein the fluorescent plate is provided with a partitioning member having apertures corresponding to a plurality of pixels arranged on the photodetection substrate; a plate for use of holding strength adhesively bonded to one face of the partitioning member; phosphor separately filled in the apertures; and a base board having the fluorescent plate and the photodetection substrate formed therefor.

In order to achieve the objectives described above, a method for manufacturing an apparatus for detecting radiation having phosphor comprises in accordance with the present invention the following steps of:

forming a phosphor layer integrally with a partitioning member having partitions per pixel of a semiconductor apparatus for detecting radiation; and separating the phosphor per pixel by removing the phosphor by the irradiation of laser beam in the form of grooves on the separating portions of the separating member, or adhesively bonding a photodetection substrate having a plurality of pixels formed thereon to a partitioning member having apertures and partitions per pixel;

forming a phosphor layer all over the partitioning member of the substrate thus bonded; and separating the phosphor per pixel by removing the phosphor layer on the partitioning portions by the irradiation of laser beam.

In this respect, the step of removing the phosphor in the form of grooves may be executed by the irradiation of excimer laser or it may be possible to arrange an outer frame on the circumference of the substrate before the formation of the phosphor layer, and then, to form the phosphor layer within such frame.

Further, it may be possible to form a reflective film on the phosphor surface including the side faces of the grooves or to form a film containing a black substance on the phosphor surface including the side faces of the grooves.

Furthermore, in accordance with the present invention, an apparatus for detecting radiation having phosphor is arranged in such a manner that each of the pixels of the apparatus for detecting radiation is provided with phosphor separated per pixel by separating portions formed on the partitioning member and the grooves on the partitioning portions of the partitioning member.

In this respect, it may be possible to provide each of the pixels of the apparatus for detecting radiation with a reflective film or a film containing a black substance formed on the partitioning member and the grooves on the partitioning portions of the partitioning member.

In this way, it is possible to coat a thick phosphor uniformly by arranging a frame having a desired height as an outer frame on a panel, thus enabling visible light to be generated in a large quantity by means of such thick phosphor, and to obtain a high sensitivity as a photodetection element.

Moreover, it is possible to arrange a meshed base so that partition plates can be installed per pixel of a semiconductor photodetection element, and to remove phosphor by the irradiation of excimer laser in the form of grooves including a part of such base, and lastly, to produce a high resolution photodetection element having no cross-talks by forming a reflective film or the like to make light convergence possible.

Also, the outer frame and meshed partition plates can be produced at low processing costs, while the throughput of the excimer laser is high. Therefore, it is possible to produce a highly sensitive and high resolution apparatus for detecting radiation at low manufacturing costs.

Also, in order to achieve the objectives described above, an apparatus for detecting radiation formed by the combination of a fluorescent plate and a photodetector is arranged as follows in accordance with the present invention:

the fluorescent plate is provided with a partitioning member (light shielding member) having apertures corresponding to a plurality of pixels arranged on the photodetector; a plate for use of holding strength adhesively bonded to one face of the partitioning member; and phosphor separated and filled in the apertures, and a base board is provided with the fluorescent plate and the photodetector being formed therefor.

In this respect, it is preferable to arrange the apertures to be recessed, and form a structure in which the base board having the fluorescent plate and the photodetector formed therefor is adhesively bonded to the side opposite to the side where the plate for use of holding strength is adhesively bonded.

Also, in accordance with the present invention, there are provided steps of:

adhesively bonding a plate for use of holding strength to a partitioning member (light shielding member) having apertures corresponding to a plurality of pixels of a photodetector;

producing a fluorescent plate by filling phosphor separately in the apertures; and adhesively bonding the fluorescent plate to the base board where the photodetector is formed.

For an apparatus for detecting radiation, which comprises a fluorescent plate and a photodetector as described above, a thin plate for use of holding strength is provided for a light shielding member to produce a fluorescent plate whose phosphor is separated by means of the light shielding member, and then, the fluorescent plate is adhesively bonded to a photodetection panel. In this way, it is possible to carry out the inspection of the fluorescent plate in advance, and to improve the yield thereof. Also, it is possible to enhance the strength of the fluorescent plate to make its handling easier.

Also, this apparatus for detecting radiation having the plate for use of holding strength, it is possible to prevent it from being deformed when it is handled, and in turn, to prevent phosphor and the light shielding member from being peeled off, thus reducing the unevenness of images significantly.

DETAILED DESCRIPTION OF THE PREFERRED EMBODIMENTS

Hereinafter, with reference to the accompanying drawings, the present invention will be described in detail.

Figure 5:
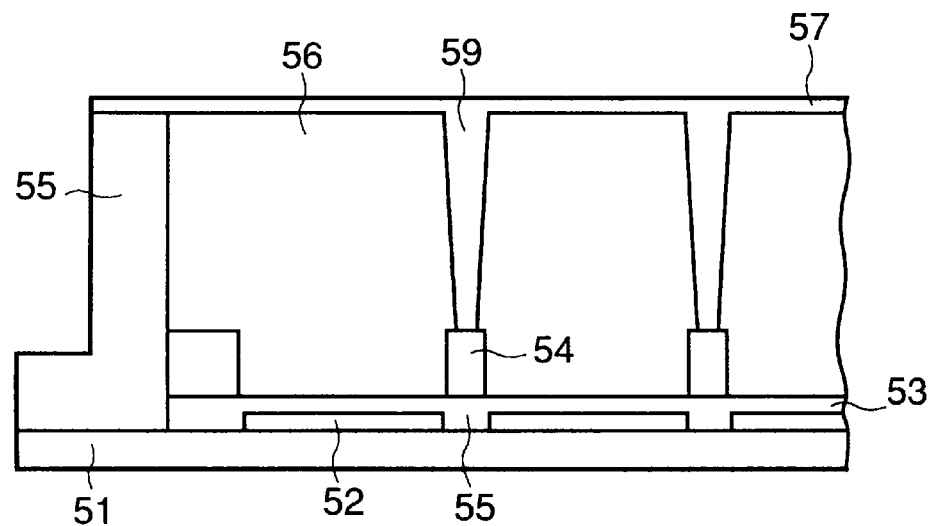
FIG. 5, FIG. 11, and FIG. 18 are cross-sectional views schematically showing an apparatus for detecting radiation, respectively.

FIG. 5 is a cross-sectional view schematically showing an apparatus for detecting radiation in accordance with one embodiment of the present invention. In FIG. 5, a reference numeral 51 designates an insulating substrate, such as a glass substrate. On this substrate, each of the pixels 52, having a sensor and TFT using semiconductor, such as amorphous silicon, is formed separately. On the surface of the substrate, $SiN_x$ or some other protection layer 53 is formed. On each of the separation grooves for each pixel 52, a meshed partition plate 54 formed by thick Ni is arranged, and phosphor 56 is filled in up to the height of an outer frame 55. The phosphor 56 is separated by the irradiation of excimer laser by the formation of grooves 59 per pixel. Then, the grooved portions are made to serve as separating portions, and a reflective film 57 is formed including such portions.

Now, with reference to FIG. 6 to FIG. 10, the description will be made of one example of a specific method for manufacturing such semiconductor apparatus for detecting radiation.

Figure 6:
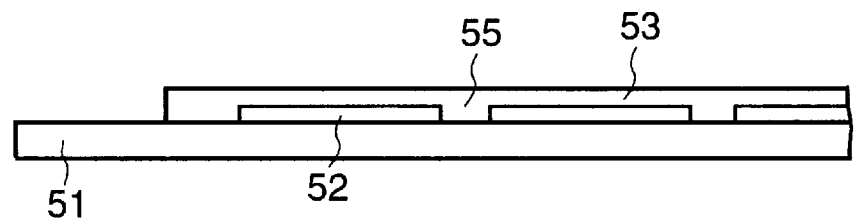
FIGS. 6, 8, 9, 10, 16, 17, 19, 21, 22, and 23 are cross-sectional views schematically illustrating one example of procedures of manufacture preferably applicable to an apparatus for detecting radiation in accordance with the present invention.

FIG. 6 is a cross-sectional view schematically showing a semiconductor photodetection element produced by the usual processing steps of fabricating an a —Si:H semiconductor thin film. Each of the pixels formed by the TFT and sensor is separated by the separation grooves per pixel. On the surface thereof, $SiN_x$ or some other protection layer 53 is formed.

Figure 7:
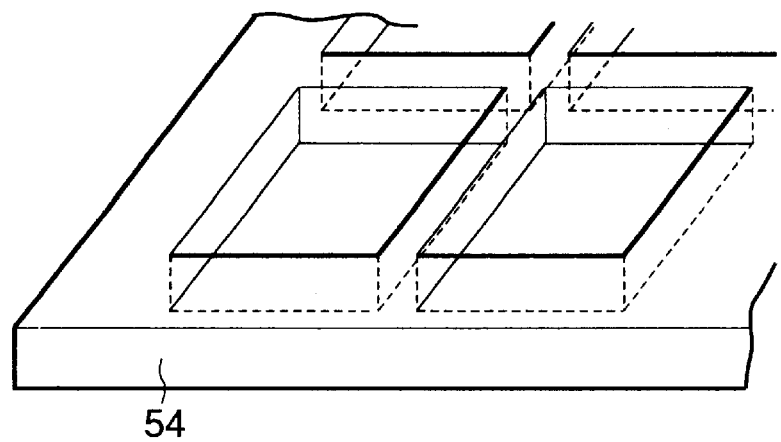
FIG. 7 and FIG. 20 are perspective views schematically showing one pixel portion of a photodetection element, respectively.

FIG. 7 is a perspective view showing a meshed partition plate 54 for use of cross-talk prevention, which is produced separately from the panel of the photodetection element represented in FIG. 6. In FIG. 7, a partition plate is prepared by use of the Ni material whose plate thickness is 40 $\mu$, and then, by means of photolithography, each of the apertures is produced at 140 $\mu$ square corresponding to each pixel with the plate width of 20 $\mu$ of the partition plate.

Figure 8:
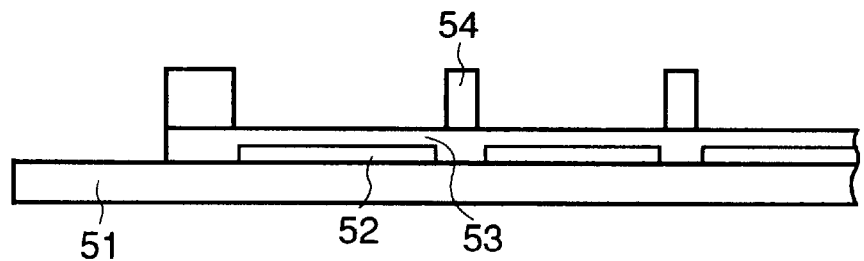

Then, as shown in FIG. 8, the panel of the photodetection element shown in FIG. 6 and the partition plate 54 shown in FIG. 8 are adhesively bonded.

Figure 9:
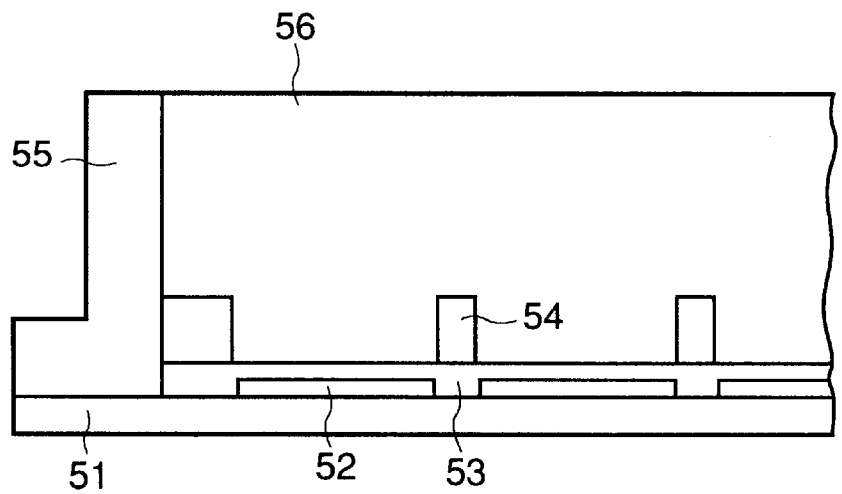

Further, as shown in FIG. 9, an outer frame 55 200 $\mu$ high is adhesively bonded on the outer side of the partition plate 54.

Then, phosphor 56 is blown out from a nozzle by means of flow coating inside the outer frame 55, and coated by leveling to a thickness of 200 $\mu$.

Figure 10:
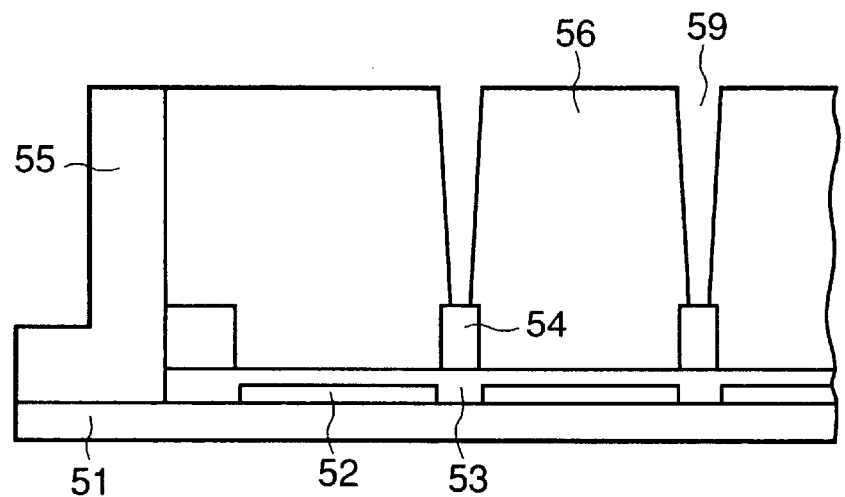

Further, as shown in FIG. 10, the phosphor thus coated in a uniform thickness is cured, and then, ablated by the irradiation of excimer laser in the form of tapered grooves to the upper face of the partition plate 54 adhesively bonded per pixel 52.

The excimer laser is set at the wavelength of KrF 248 nm in the energy concentration of 0.6 $J/cm^2$. A mask mounted on the optical system is used to provide an alignment on the meshed Ni of the partition plate 54, thus removing the phosphor partially. In this case, with the energy concentration of 0.6 $J/cm^2$, the Ni of the partition plate 54 serving as a base material is also removed at the same time, but its thickness being made 40 $\mu$, there is no possibility that any damage is given to the protection film 53. The operation is completed with the partition plate 54 being left intact in the midway of its thickness.

After that, Al is formed by means of deposition as a reflective film 57 including the side faces of the grooves thus produced by the irradiation of excimer laser. In this way, the apparatus for detecting radiation shown in FIG. 5 is completed.

In accordance with the mode embodying the present invention, if only the height of the outer frame 55 is arbitrarily modified, the thickness of phosphor 56 can be formed in a desired thickness. Further, since the thickness of the partition plate 54 is comparatively thick, it is possible to produce this plate at lower costs by means of the usual photolithographing technique. Also, there is no problem of rigid control required for obtaining the selection ratio related to a base material when the excimer laser processing is performed. In this way, the phosphor can be partially separated per pixel.

Moreover, since the reflective film is formed including the grooves for use of pixel separation, it is possible to transform incident radiation into visible light in a large quantity by the provision of a thick phosphor. The visible light thus transformed is converged by the grooves and the reflective film 57 sufficiently onto each pixel 52 of the semiconductor photodetection element. In this way, it is converted into electric signals in a sufficient quantity without generating any cross-talks.

Also, the processing steps being simple, a high performance apparatus for detecting radiation can be manufactured at low cost.

Here, in accordance with the mode embodying the present invention, Ni is used as a partition plate, but it is possible to use other metallic materials, such as Al, Cr, or ceramics, among others, for the formation of the partition plate, and to obtain the same effect.

Further, in accordance with the mode embodying the present invention, the wavelength of KrF 248 nm is adopted for the excimer laser, but the same effect is also obtainable by selecting a wavelength that can ablate the phosphorous material from among ArF 193 nm, XeCl 308 nm, XeF 351 nm, and the like, for example. Also, an example is shown, in which a reflective film of Al is formed with respect to the grooves, but the present invention is not necessarily limited to Al. It may be possible to use Cr, Ti, or some others for the formation of the film. Further, it is possible to obtain the same effect by use of a black resin, a resin containing C to absorb light, for example.

Also, as means for removing phosphor in the form of grooves, an example is shown, in which the ablation is conducted by the irradiation of excimer laser, but it is of course possible to use any other kind of laser beam if it can obtain the same effect.

Figure 11:
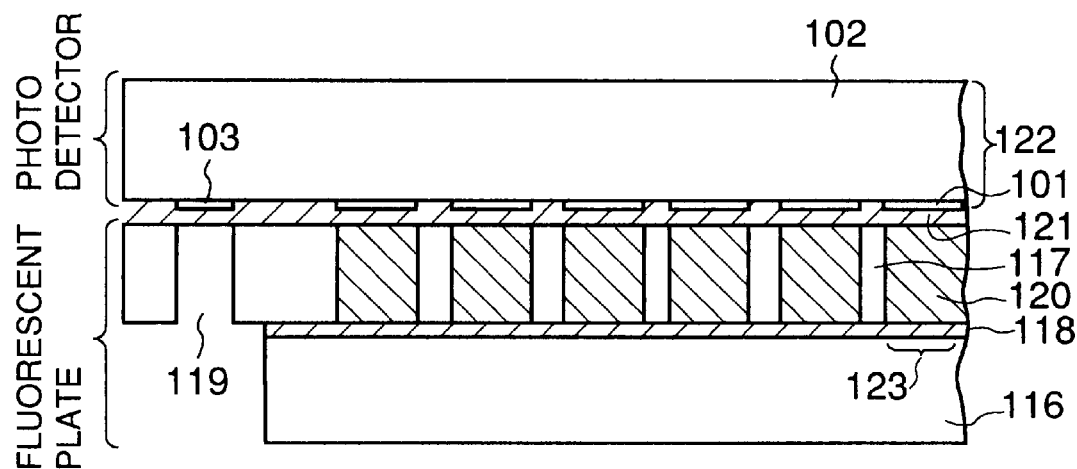

FIG. 11 is a cross-sectional view schematically showing the structure of a radiation detector embodying the present invention. In FIG. 11, a reference numeral 122 designates a photodetector; 101, a pixel; 121, an adhesive layer; 117, light shielding mesh; 120, phosphor; 118, an adhesive layer; 116, a plate for use of holding strength; 123, an aperture for the light shielding mesh 117; 103, an alignment mark; 119, an aperture for use of alignment; and 102, a substrate for the photodetector.

Figure 12:
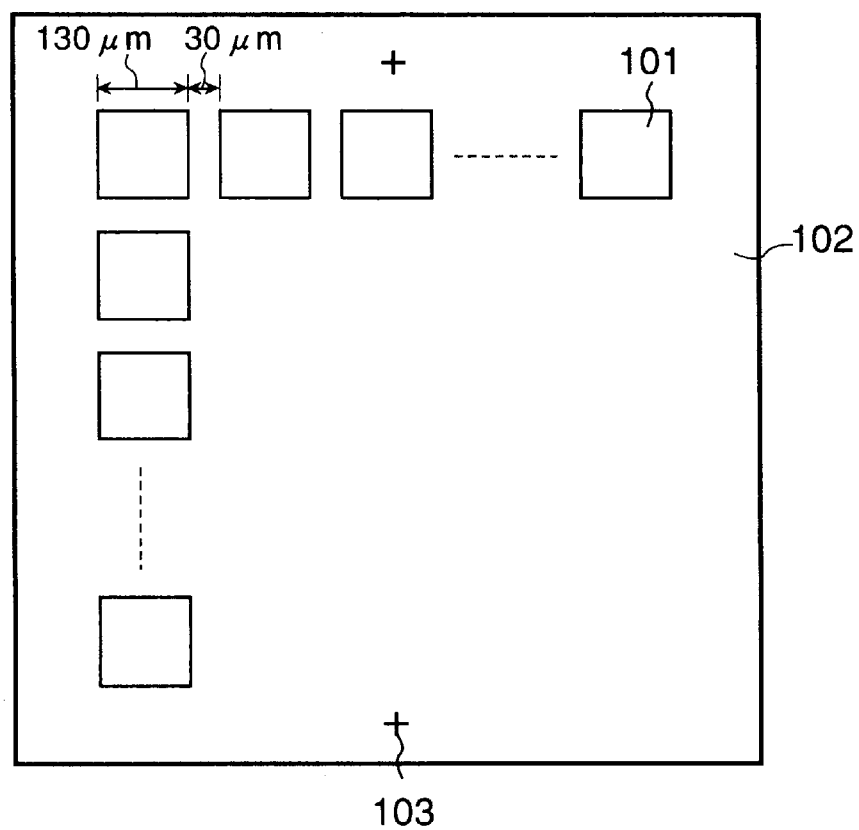
FIG. 12 is a plan view schematically showing a photodetection member.

FIG. 12 is a plan view schematically showing a photodetector used for the mode embodying the present invention. In FIG. 12, pixels 101 are arranged crosswise at pitches of 160 micron, for example. The size of each pixel is 130 micron, for example. An interval between each of the pixels can be 30 micron. The substrate 102 of the photodetector formed by a low alkali glass of 0.7 mm thick (Corning's 7059 glass, for example). Also, on the glass substrate, there are arranged alignment marks 103 to be used when a fluorescent plate is adhesively bonded. Here, it is possible to use a large-sized substrate whose outer shape is approximately 500 mm square.

Figure 13:
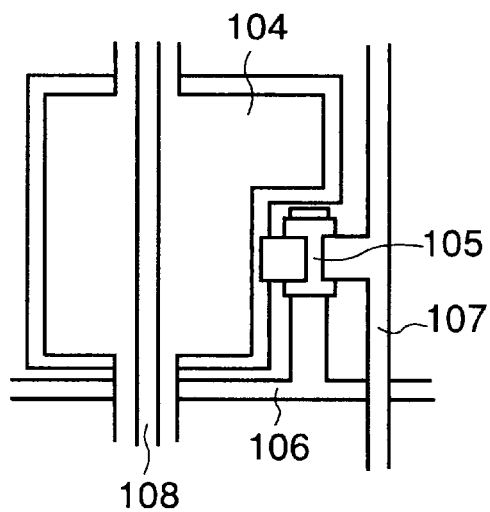
FIG. 13 is a plan view schematically showing one pixel portion of a photodetection element.

FIG. 13 is a plan view schematically showing one pixel of a photodetector. In FIG. 13, the pixel comprises a sensor unit 104 and a TFT unit 105. The TFT is turned on by the transmission signal transmitted from a gate line 106. The signal load deposited in the sensor unit 104 is transmitted to a signal line 107, which is read out as image signals. Lastly, the sensor is reset by means of a common resetting line 108 to complete one image reading.

Figure 14:
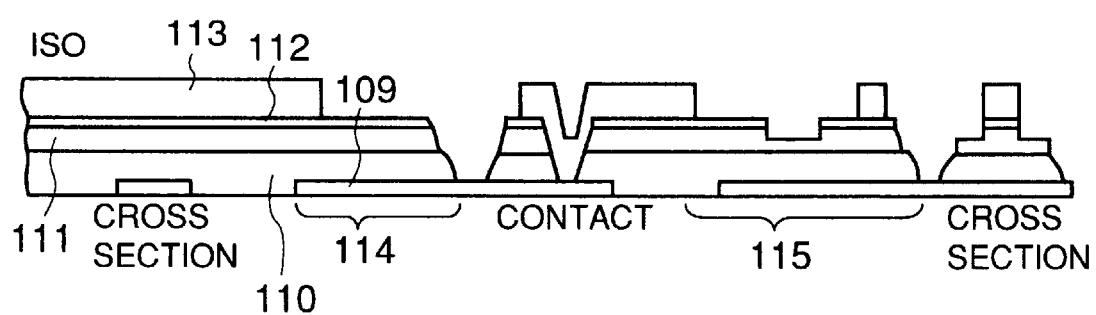
FIG. 14 is a cross-sectional view schematically showing one pixel portion of a photodetection element.

FIG. 14 is a cross-sectional view schematically showing one example of a pixel portion of a photodetector. In FIG. 14, the pixel comprises, from its lower side, a gate metal 109 (100 nm) formed by Cr; a plasma nitride film 110 (300 nm); a hydro-amorphous silicon layer 111 (500 nm); doping semiconductor layer 112 (50 nm); and aluminum layer 113 (1,000 nm). In other words, the sensor unit 114 and the TFT unit 115 are provided with the same hydro-amorphous silicon layer. It is of course possible to apply to the present invention a photodetector having a different structure using hydro-amorphous silicon or a photodetector using non-monocrystalline silicon or crystalline silicon other than hydro-amorphous silicon.

Now, with reference to each of the accompanying drawings, the description will be made of the manufacturing steps of a fluorescent plate to be used in the mode embodying the present invention.

Figure 15:
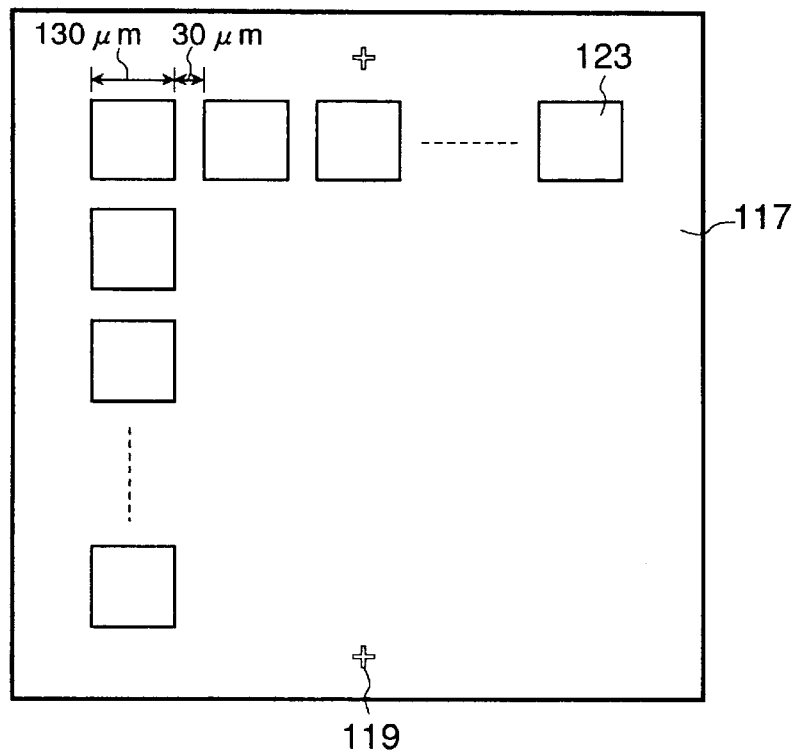
FIG. 15 is a plan view schematically showing a light shielding member.

FIG. 15 is a plan view schematically showing a mesh for use of light shielding in the mode embodying the present invention. In FIG. 15, for the mesh 117 for use of light shielding, a meshed nickel plate of 200 μ thick can be used, for example. Also, the meshed apertures 123 are arranged to correspond to the pixels 101 of the photodetector one to one, and also, arranged crosswise at pitches of 160 μ so as to match the pixels. The size of each aperture 123 can be 130 μ, for example. Also, apertures 119 for use of alignment are provided to make alignment with the photodetector substrate.

Figure 16:
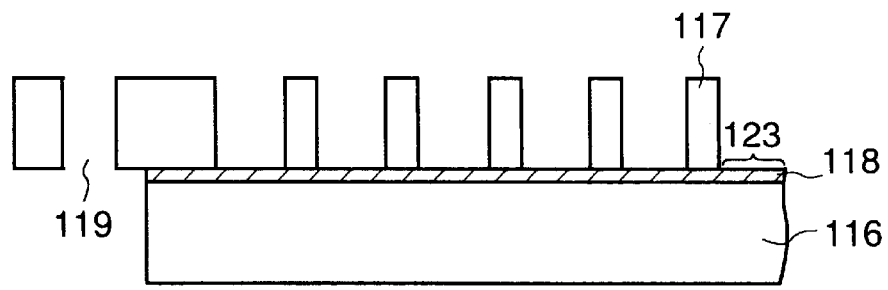

Now, as shown in FIG. 16, a cross-sectional view, the mesh 117 for use of light shielding and the plate 116 for use of holding strength are bonded together through the adhesive layer 118. As the plate 116 for use of holding strength, it is possible to use a plate of 2 mm produced by baking carbon graphite fiber.

Figure 17:
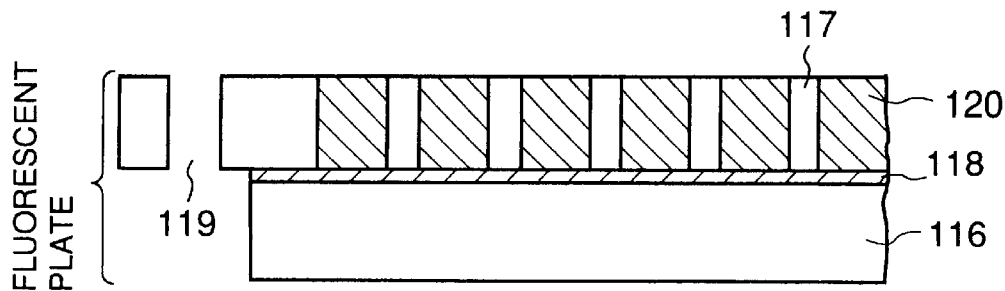

Then, as shown in FIG. 17, a schematically sectional view, a paste 120, which is prepared by dispersing fine powder of phosphor in a resin binder, is poured in between meshes. Then, in continuation, the surface of meshes is made flat by use of a squeegee. After that, it is heated to polymerize the binder. In this case, a material combination is selected so as to arrange the softening temperature of the adhesive agent 118 to be higher than the polymerization temperature of the binder. In this way, the fluorescent plate portion is completed.

Now, as shown in FIG. 11 (a schematically sectional view), this fluorescent plate and the photodetector 122 are bonded through the adhesive layer 121. At this juncture, the pixels and phosphor are positioned by use of the alignment marks 103 and the alignment apertures 119.

Since this fluorescent plate has a sufficient strength by the provision of the plate 116 for holding strength, there is an advantage that phosphor can hardly be damaged at the time of handling. Therefore, a simple and inexpensive handling device can be used for the purpose.

In this respect, the apertures of the meshed plate for use of light shielding may be formed as recessed portions, and phosphor is filled in each of the recessed portions after a plate for holding strength is adhesively bonded to the meshed plate in order to prepare a fluorescent plate. Then it is adhesively bonded to a photodetector for completion.

Figure 4:
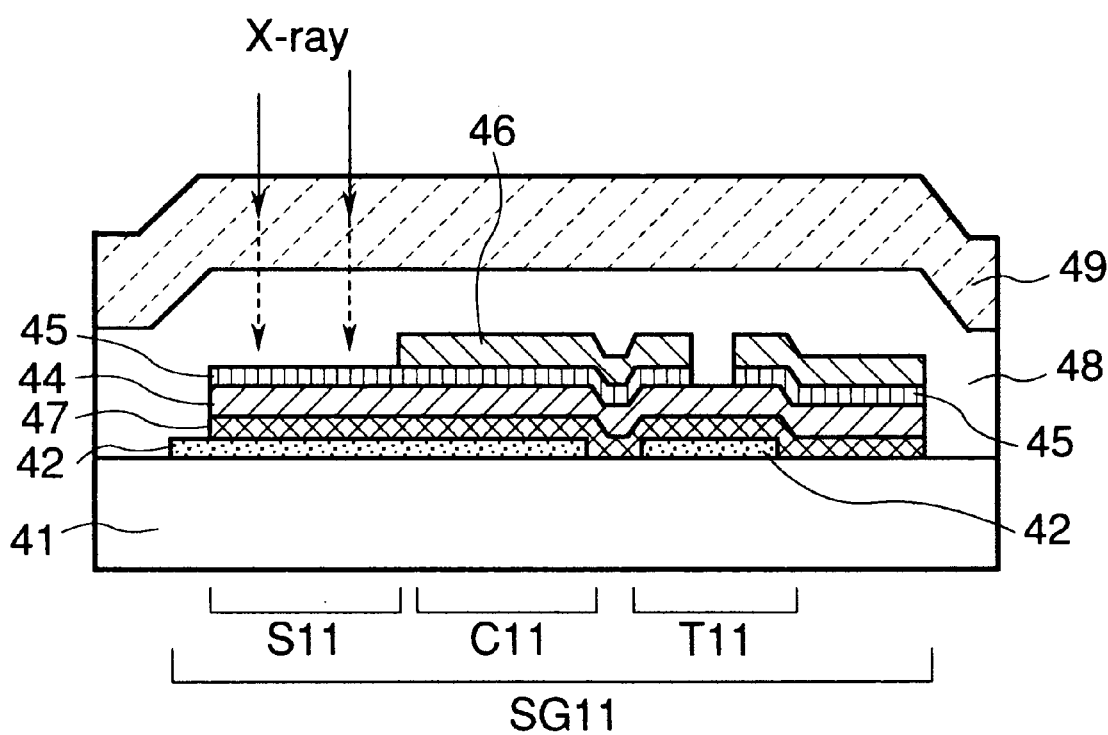
FIG. 4 is a cross-sectional view schematically illustrating one example of the positional relationship between a semiconductor photodetection element having a sensor, TFT (Thin Film Transistor), and capacitor for every pixel thereof, and phosphor.

Now, regarding an apparatus for detecting radiation in which TFT and sensor are formed per pixel, the description will be made further of structures as shown in FIG. 4 and FIG. 14, which are schematically sectional views, respectively.

In FIG. 4, on an insulating substrate 41, there are formed a conductive layer 42 serving as a gate electrode; an insulating layer 47 serving as a gate insulation layer; an a —Si:H semiconductor layer 44; a doping semiconductor layer 45; a conductive layer 46 serving as a main electrode, which comprises a TFT (T11) and the conductive layer 42 serving as a lower side electrode; an insulating layer 47; an MIS type sensor (S11) comprising the a —Si:H semiconductor layer 44 and the doped semiconductor layer 45; and a capacitor (C11) comprising the conductive layer 42 serving as a lower side electrode, the insulating layer 47, the a —Si:H semiconductor layer 44, the doping semiconductor 45, and the conductive layer 46 serving an upper electrode. Each of these elements thus arranged constitutes one pixel, respectively.

Further, many numbers of the same pixels are arranged on a large two dimensional area. Then there are provided a protection layer 48 formed by $SiN_x$ to protect each of the pixels, and phosphor 49 to transform incident radiation into visible light, thus constituting an apparatus for detecting radiation capable of dealing with a large area.

As regards the examples of structures shown in FIG. 4 and FIG. 14, if the thickness of phosphor 49 is increased to enhance its sensitivity, for example, the incident X-rays are transformed in the phosphor 49 into visible rays in a large quantity. Therefore, the sensitivity of the sensor unit at S11 is increased. The function of the sensor is enhanced accordingly, but there occurs a drawback in some cases such that the visible rays thus transformed also act upon TFT at T11 to cause the TFT to malfunction due to the rays incident upon it.

Further, as a method to eliminate such drawback, it is conceivable to make an arrangement so that a shielding film is formed between the phosphor 49 and the upper part of the TFT by means of photolithography and a thick film deposition technique as well. However, there occurs a problem in some cases that due to increased processing steps needed for the provision of the shielding film, not only throughput becomes unfavorable, but also, yield becomes lowered, thus making it impossible to manufacture an apparatus having a structure of the kind at low cost.

The problem may become more serious if a TFT should be exposed to any incident light from the phosphor that is arranged for a pixel other than the pixel for which this particular TFT is provided.

For the present invention, therefore, it is preferable to use a method for manufacturing an apparatus for detecting radiation having phosphor comprising the steps of forming a photodetector substrate provided with pixels having a plurality of semiconductor elements and TFT; forming a partition plate provided with the light shielding portion of the TFT unit together with apertures per pixel; adhesively bonding the photodetector substrate and the partition plate; forming an outer frame on the circumference of the partition plate adhesively bonded to the substrate; forming a phosphor layer inside the outer frame on the partition plate; and separating the phosphor layer per pixel by removing the phosphor layer by the irradiation of laser beam in the form of grooves along the partitioning portions of the apertures per pixel. It is more preferable to arrange an apparatus for detecting radiation having phosphor, a plurality of pixels and TFT so as to provide such apparatus with a meshed partition plate having the apertures per pixel and the light shielding portion of the TFT integrally formed, and with phosphor arranged on the apertures of the partition plate, which is separated in the form of grooves per pixel on the partitioning portions of the partition plate.

As described above, by arranging a frame of a desired height as the outer frame on a photodetector applicable to an apparatus for detecting radiation for the execution of the thick and uniform coating of phosphor, it is possible to obtain a higher resolution, in addition to the generation of visible light in a larger quantity by the provision of such thick phosphor, hence improving the sensitivity of the photodetection element.

Moreover, by arranging a meshed member including a partition plate integrally formed with a member capable of shielding the upper part of TFT per pixel of a photodetector, there is no light incident upon the TFT, thus making it possible to prevent any malfunction thereof due to light.

Also, phosphor is removed by the irradiation of excimer laser in the form of grooves partly including a partition plate. In this way, it is possible to produce the partition plate formed integrally with the outer frame and meshed light shielding member at lower costs. Here, the throughput of excimer laser is high. As a result, a stable semiconductor apparatus for detecting radiation can be manufactured in a high sensitivity and resolution at lower costs.

In addition, by forming a reflective film or a film containing a black substance, light is converged per pixel, thus making it possible to obtain a resolution photodetection element having no cross-talks.

In this respect, it may be possible to form a reflective film on the surface of phosphor separated as described above, which includes the grooved portions. Also, it may be possible to form a film containing a black substance on the surface of phosphor separated as described above, which includes the grooved portions.

Hereinafter, with reference to the accompanying drawings, the detailed description will be made of a case where a light shielding portion is arranged in accordance with the present invention.

Figure 18:
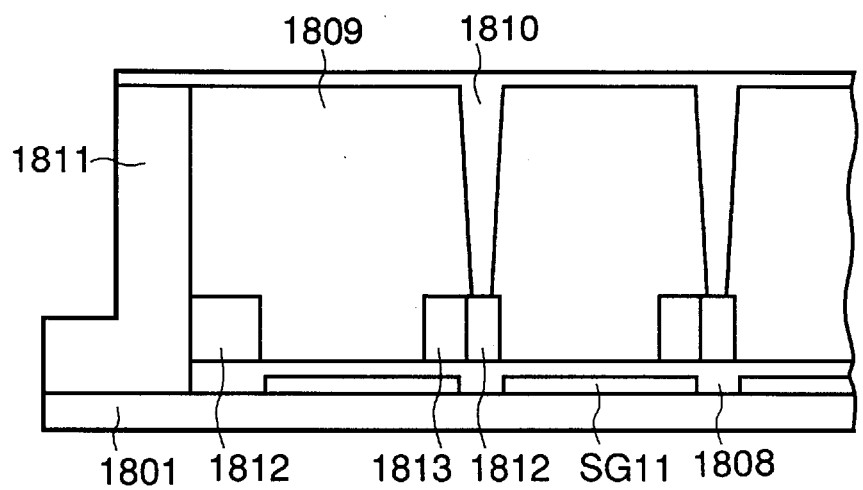

FIG. 18 is a cross-sectional view schematically showing an apparatus for detecting radiation, which represents one mode embodying the present invention. In FIG. 18, a reference numeral 1801 designates an insulating substrate such as a glass substrate. On this substrate, a pixel SG11 is separately arranged with sensor, TFT, and capacitor using a semiconductor thin film formed by amorphous silicon. On the surface thereof, a protection layer 1808 formed by $SiN_x$ is arranged. On the separation groove on each pixel, a meshed partition plate 1812 formed by thick Ni is arranged integrally with the light shielding portion 1813 of the TFT. Phosphor 1809 is filled in up to the height of an outer frame 1811. The phosphor 1809 is then separated per pixel by the irradiation of excimer laser to form a reflective film 1810 including the grooved portion of each pixel.

Now, in conjunction with FIG. 19 to FIG. 23, the description will be made of a specific method for manufacturing this semiconductor apparatus for detecting radiation.

Figure 19:
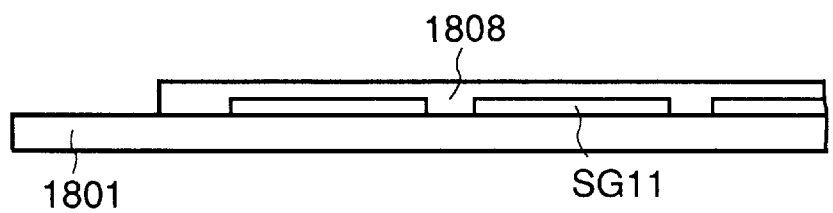

FIG. 19 is a cross-sectional view schematically showing the arrangement of large semiconductor photodetection elements, which are produced in accordance with the usual processing steps of an a —Si:H semiconductor thin film. Each pixel SG11 formed by TFT, sensor, and capacitor (not shown) is separately arranged, and on the surface thereof, a protection layer 1808 of $SiN_x$ is formed.

Figure 20:
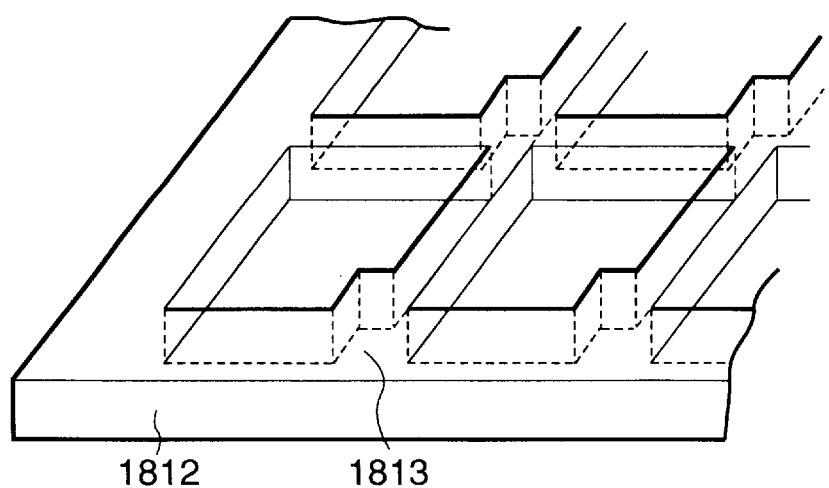

FIG. 20 is a perspective view schematically showing the structure of a meshed partition plate 1812 for cross-talk prevention formed integrally with the light shielding member 1813 of TFT, which is produced separately from the panel represented in FIG. 19.

The partition plate 1812 shown in FIG. 20 can be produced in such a manner that a Ni material of 40 μ thick is used, for example, and by means of lithography it is produced to be a partition plate 1812 whose width is 20 μ with each aperture of 140 μ square provided by removing the light shielding portion of the TFT per pixel SG11 accordingly.

Figure 21:
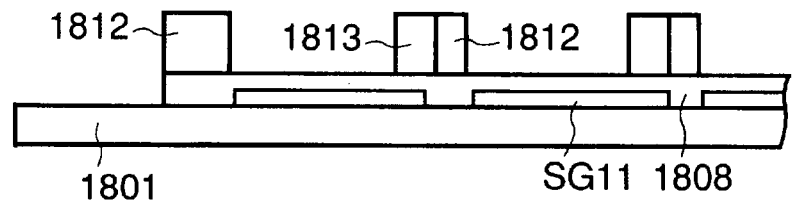
Figure 22:
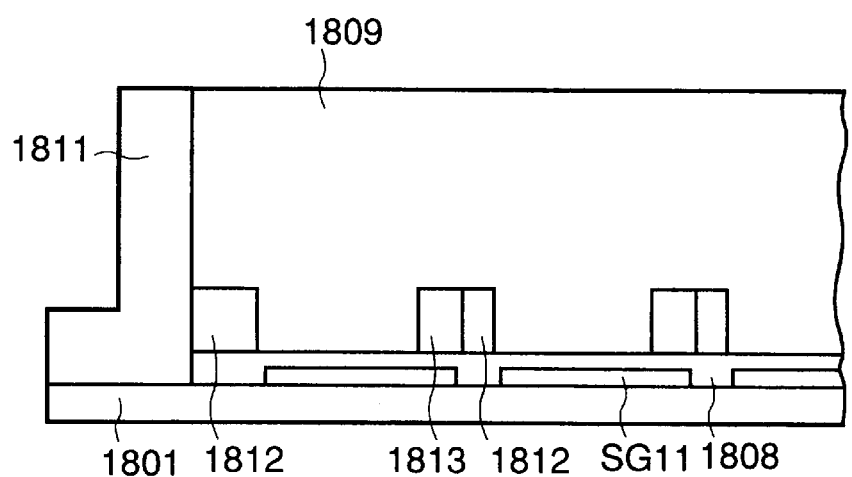
Figure 23:
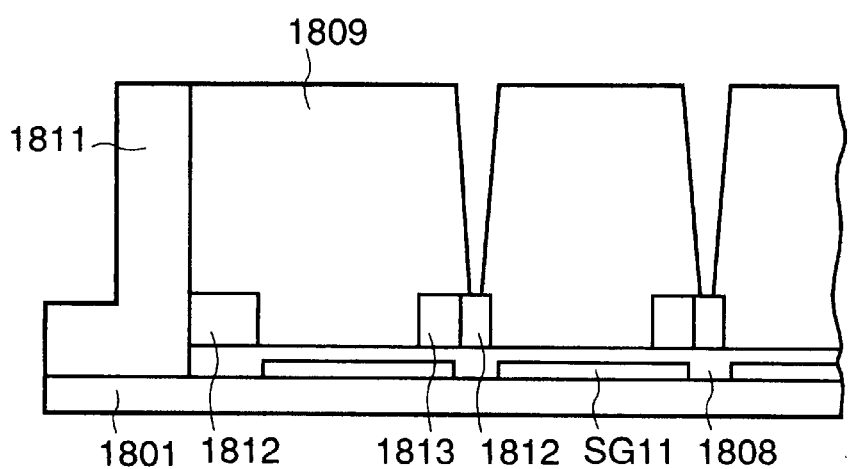
Figure 1:
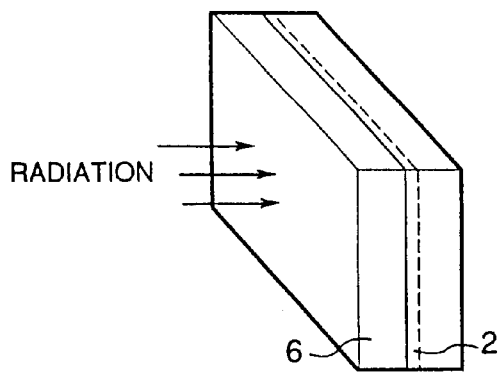
Figure 2:
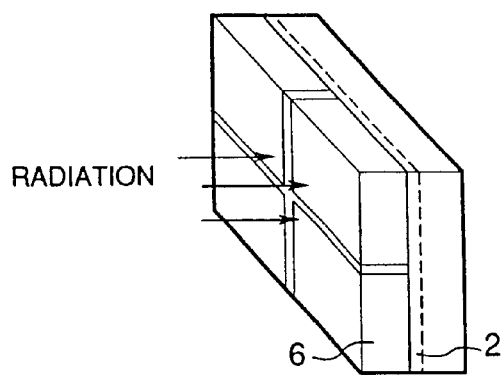
Figure 3:
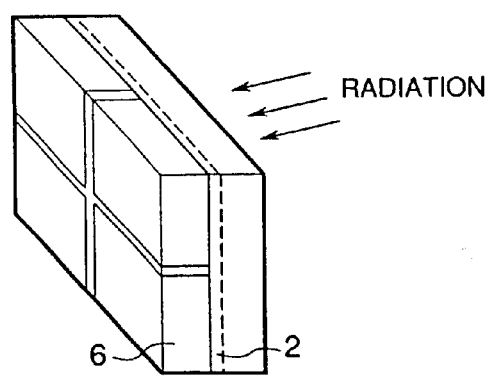
Figure 5:
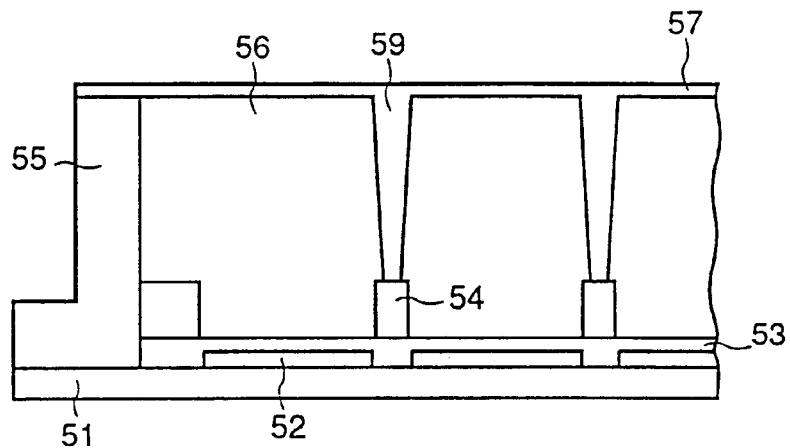
Figure 6:
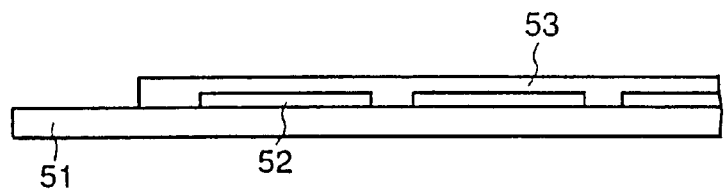
Figure 7:
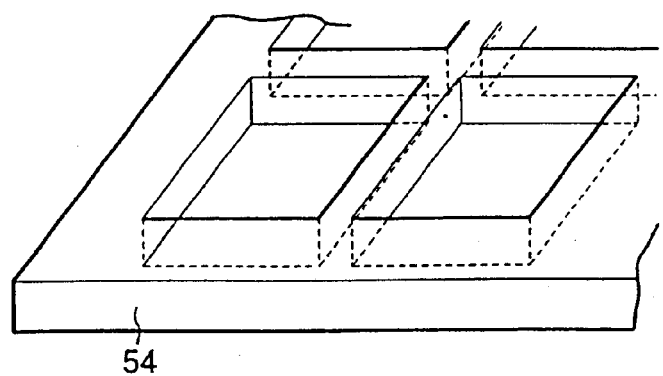
Figure 18:
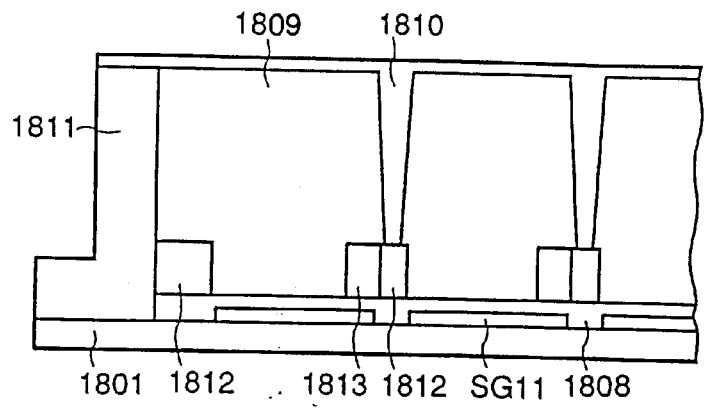
Figure 19:
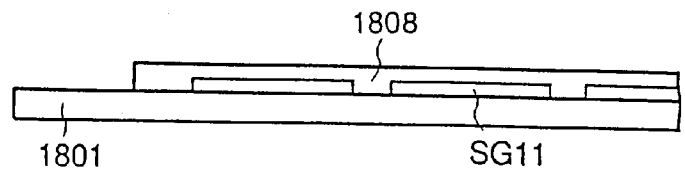
Figure 20:
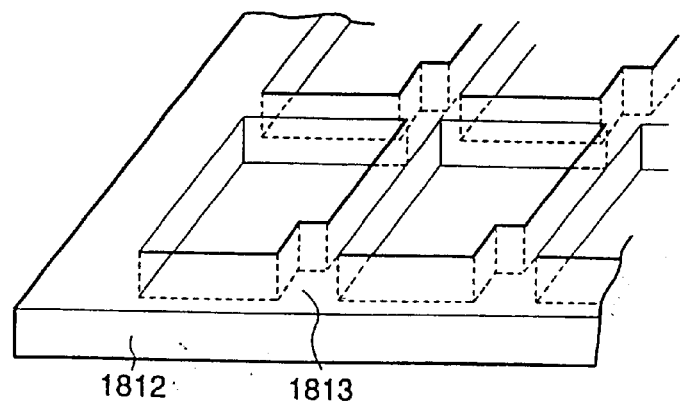

Then, as shown in FIG. 21, a partition plate 1812 is formed by adhesively bonding the panel shown in FIG. 19 and the light shielding member shown in FIG. 20, and further, as shown in FIG. 22, an outer frame 1811 of 200 μ high, for example, is adhesively bonded to the outer side of the partition plate. After that, phosphor 1809 is blown out from a nozzle inside the outer frame 1811 by means of the flow coating method and leveling to coat it in a thickness of 200 μ, for example. Further, as shown in FIG. 23, the phosphor 1809, which is coated in a uniform thickness, is cured and ablated by the irradiation of excimer laser in the form of tapered grooves to the upper face of the bonded partition plate 1812 per pixel SG11.

The excimer laser is used at a wavelength of KrF 248 nm with the energy concentration of 0.6 J/cm$^2$. A mask mounted on the optical system is used to remove the phosphor 1809 partially, while the alignment being made in advance with the meshed Ni of the partition plate 1812. In this case, with the energy concentration of 0.6 J/cm$^2$, the Ni of the partition plate 1812, which serves as the base material, is also removed at the same time. However, since the thickness thereof is made 40 μ, the removal operation can be completed in the midway with respect to the thickness of the partition plate 1812 so as to allow this plate to remain without causing any damage to the protection film 1808.

After that, by Al deposition, a reflective film 1810 is formed including the side faces of the grooves produced by the irradiation of excimer laser. In this way, an apparatus for detecting radiation is completed as shown in FIG. 18.

In accordance with this example, if only the height of the outer frame 1811 is modified, the phosphor 1809 can be arbitrarily formed in a thickness as desired. Further, since the thickness of the partition plate 1812 is comparatively large, it is possible to form this plate by means of the usual photolithographic process at lower costs. Moreover, it is possible to integrally form the light shielding member 1813 of the TFT. Consequently, there is no need for any rigid control that should otherwise be given to the aspect of selection ratio related to the base material when the process is executed by the irradiation of excimer laser to separate the phosphor 1809 partially per pixel. Moreover, since the reflection film 1810 is formed including the grooves for use of pixel separation, it is possible to transform the incident radiation into visible light in a large quantity by the provision of the thick phosphor. The transformed visible light can be converged to each of the pixels SG11 of semiconductor photodetection element sufficiently by means of the grooves and the reflective film 1810 thus formed. The TFT is shielded by means of the light shielding member 1813 integrally formed with the partition plate 1812. Therefore, it is possible to obtain electric signals in a sufficient quantity without any cross-talks. Also, the TFT is not caused to generate any malfunction due to light. Further, the processing steps being simple, a high performance semiconductor apparatus for detecting radiation can be manufactured at lower costs.

In this respect, in accordance with this example, Ni is used as the partition plate integrally formed with the light shielding member, but it is possible to obtain the same effect by forming a partition plate with Al or Cr or other metallic materials or ceramics or the like as described earlier.

Further, in accordance with this example, the excimer laser whose wavelength is KrF 248 nm is adopted, but as described earlier, it is possible to obtain the same effect by selecting a wavelength for the intended ablation from among ArF 193 nm, XeCl 308 nm, XeF 351 nm, or the like, depending on the phosphor material to be processed.

Here, any laser other than excimer laser can be used likewise, of course, if the same effect is obtainable. Also, an example is shown in which a reflective film is formed for grooves using Al, but the present invention is not necessarily limited to the use of Al in this respect. Cr, Ti, or the like can be used for the formation of the reflective film. Moreover, it is possible to obtain the same effect by use of a black resin that contains C in it or the like to abosrb light, for example.

As described above, in accordance with the present invention, a thick meshed member is arranged as a base material to separate phosphor per pixel, and by the irradiation of excimer laser or the like, for example, the surface of such meshed partition plate is removed in the form of grooves. In this way, it is possible to prevent cross-talks easily without any particular control of the selection ratio related to the base material, and also, without damaging the pixels.

Further, since the outer frame can be arbitrarily arranged in a large thickness, it is possible to form phosphor in a desired thickness in order to generate visible light in a large quantity. Therefore, a highly sensitive apparatus for detecting radiation is obtainable.

Moreover, it is possible to produce the meshed partition plate to be used at lower costs, while the irradiation of excimer laser or the like has a high throughput. Therefore, its production yield can be improved, and in turn, a high performance apparatus for detecting radiation can be manufactured at lower costs.

Also, in accordance with the present invention, a plate for use of holding strength is arranged. As a result, phosphor and meshes are difficult to peeled off even if the photodetector is held in a cantilever fashion at the time of handling, for example. In this way, it is possible to produce a photodetector capable of forming images without any unevenness.

Also, when this photodetector is incorporated in a housing, it is possible to adopt a simpler and more inexpensive jig for mounting.

Also, even when the aperture ratio is made greater, the strength of the substrate is not weakened. Therefore, the phosphor interface is not caused to be peeled off partially due to bending stress or the like at the time of handling. Hence, no image unevenness is generated.

Furthermore, in accordance with the present invention, a thick meshed member is integrally formed with a light shielding member in order to separate phosphor per pixel and prevent light from being incident upon the TFT. Then, by the irradiation of excimer laser, the surface of the meshed partition plate is removed in the form of grooves, it is possible to easily prevent cross talks without any particular control of the selection ratio related to the base material, and also, without should read damaging the pixels. Further, it is possible to eliminate any light incident upon the TFT to prevent any malfunction thereof due to light.

Further, in this case, too, it is possible to produce the meshed partition plate integrally formed with the light shielding member at lower costs, while the throughput of the laser process by the irradiation of excimer laser or the like is high. Thus, in turn, it is possible to improve the production yield and manufacture a high performance apparatus for detecting radiation at lower costs.

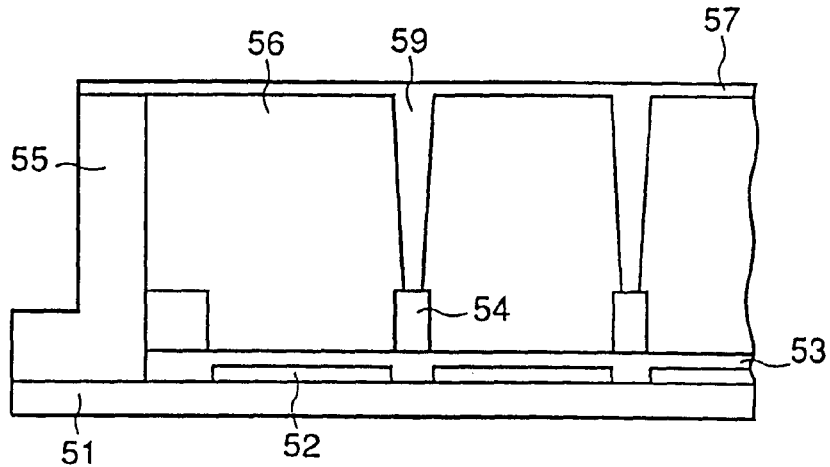

What is claimed is:

1. A semiconductor apparatus for detecting radiation provided with phosphor and a substrate having a plurality of photodetection elements thereon, said photodetection elements comprising pixels wherein each pixel is separated by a space on each side of the pixel, each of said pixels of said substrate being provided with corresponding phosphor, said phosphor being separated per pixel by a separating portion, said separating portion being defined by a groove in said phosphor, said groove terminating at a partitioning portion located in the space between pixels, said partitioning portion being provided on a protective member which protects said photodetection elements.

2. An apparatus according to claim 1, wherein a film containing a black substance is formed on said phosphor, including in said separating portions.

3. An apparatus according to claim 1, wherein said partitioning portion is adhesively bonded to a supporting member.

4. An apparatus according to claim 1, wherein, at least one pixel of said photodetection elements is provided with at least a sensor unit and a transistor unit.

5. An apparatus according to claim 4, further comprising means for light-shielding said transistor unit.

6. An apparatus according to claim 5, wherein said light-shielding means is a portion of said separating portion.

7. An apparatus according to claim 1, wherein said partitioning portion has a meshed configuration.

8. An apparatus according to claim 1, wherein said partitioning portion has apertures arranged to correspond to one of said pixels.

9. An apparatus according to claim 1, wherein said plurality of photodetection elements contains a non-monocrystalline semiconductor layer.

10. An apparatus according to claim 1, wherein said separating portion is provided with a reflective film.

11. An apparatus according to claim 10, wherein said reflective film is disposed on said phosphor.

12. A semiconductor apparatus for detecting radiation comprising:

a photodetector having a plurality of pixels arranged on a substrate, wherein each pixel is separated from an adjacent pixel; and a phosphor layer comprising a plurality of phosphor blocks provided correspondingly to each said pixel, each said phosphor block terminating at a protecting partitioning portion formed of metal or ceramics, said projecting partitioning portion being provided between adjacent pixels, each said phosphor block being separated from an adjacent phosphor block by a separating portion including metal or carbon and provided on each said phosphor block, said separating portion being defined by a groove formed in said Phosphor layer.

* * * * *

UNITED STATES PATENT AND TRADEMARK OFFICE
CERTIFICATE OF CORRECTION

PATENT NO. : 6,133,614
DATED : October 17, 2000
INVENTOR(S) : Tatsumi Shoji et al.

It is certified that error appears in the above-identified patent and that said Letters Patent is hereby corrected as shown below:

<u>Title page,</u>
The title page should be deleted and substitute therefore the attached title page.

Figure 1:
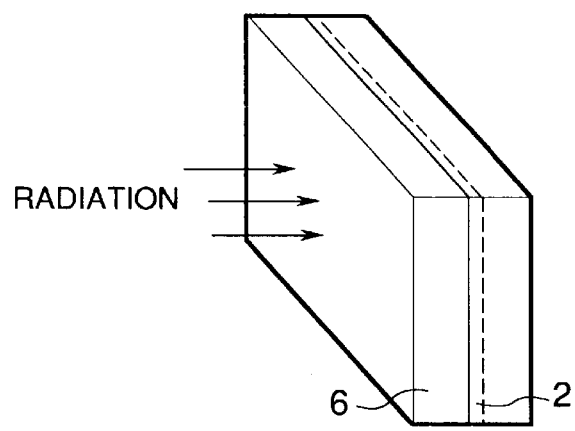
FIG. 1 to FIG. 3 are perspective views which schematically illustrate one example of the positional relationship between semiconductor photodetection elements (photoelectric conversion elements) and phosphor, respectively.
Figure 2:
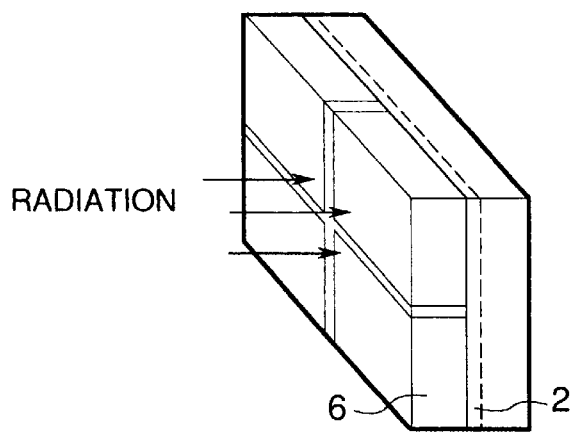
Figure 3:
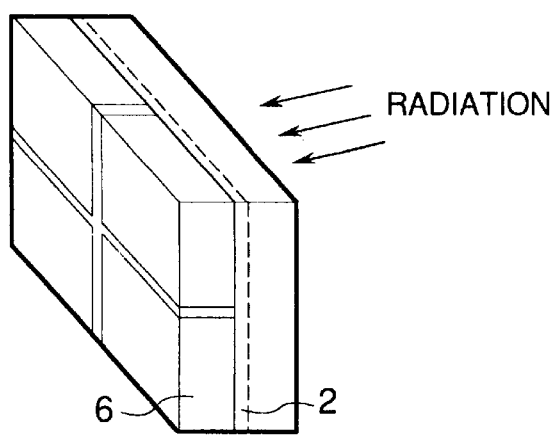

<u>Drawings,</u>
Figs. 1 to 3, sheet 1 of 9, should be replaced with the attached;
Figs. 5 to 7, sheet 3 of 9, should be replaced with the attached; and
Figs. 18 to 20, sheet 8 of 9, should be replaced with the attached.

<u>Column 1,</u>
Line 25, "resolution;" should read -- resolution, --.

<u>Column 2,</u>
Line 10, "damages" should read -- damage --;
Line 12, "greater" should read -- greater, --;
Line 17, "is" should read -- can be --; and
Line 29, "results," should read -- result, --.

<u>Column 12,</u>
Line 16, "cross talks" should read -- cross-talks --; and
Line 41, "peeled" should read -- peel.

<u>Column 14,</u>
Line 21, "protecting" should read -- projecting --.

Signed and Sealed this

Tenth Day of September, 2002

*Attest:*

JAMES E. ROGAN
*Director of the United States Patent and Trademark Office*

*Attesting Officer*

United States Patent [19]

Shoji et al.

[11] Patent Number: 6,133,614
[45] Date of Patent: *Oct. 17, 2000

[54] APPARATUS FOR DETECTING RADIATION AND METHOD FOR MANUFACTURING SUCH APPARATUS

[75] Inventors: Tatsumi Shoji, Hiratsuka; Keiichi Kawasaki, Tokyo; Isao Tanikawa, Hiratsuka; Kazuaki Tashiro, Hadano; Ichiro Tanaka, Atsugi; Tatsuya Yamazaki, Zushi, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/697,281

[22] Filed: Aug. 27, 1996

[30] Foreign Application Priority Data

Aug. 28, 1995  [JP]  Japan ................................... 7-219308
Aug. 28, 1995  [JP]  Japan ................................... 7-219309
Aug. 28, 1995  [JP]  Japan ................................... 7-219310

[51] Int. Cl.$^7$ ................ H01L 31/00; H01L 31/115; H01L 31/0232
[52] U.S. Cl. ................ 257/443; 257/429; 257/436; 257/444; 250/484.4; 250/581
[58] Field of Search ................ 250/581, 484.4; 257/428, 429, 436, 444, 443

[56] References Cited

U.S. PATENT DOCUMENTS

| | | | |
|---|---|---|---|
| 4,914,301 | 4/1990 | Akai | 257/428 |
| 5,041,729 | 8/1991 | Takahashi et al. | 250/370.11 |
| 5,187,369 | 2/1993 | Kingsley et al. | 250/370.11 |
| 5,430,298 | 7/1995 | Possin et al. | 250/370.11 |

FOREIGN PATENT DOCUMENTS

| | | | |
|---|---|---|---|
| 53-96789 | 8/1978 | Japan | H01L 31/00 |
| 5-60871 | 3/1993 | Japan | G01T 1/20 |
| 7-111322 | 4/1995 | Japan | . |

OTHER PUBLICATIONS

European Search Report dated Sep. 22, 1998.

*Primary Examiner*—Ngân V. Ngô
*Attorney, Agent, or Firm*—Fitzpatrick, Cella, Harper & Scinto

[57] ABSTRACT

A method for manufacturing a semiconductor apparatus for detecting radiation provided with phosphor comprises the steps of forming a phosphor layer integrally with a meshed partition plate having partitions per pixel of the semiconductor apparatus for detecting radiation, and of separating the phosphor per pixel by removing the phosphor on the partitioning portion of the partition plate by the irradiation of laser beam in the form of grooves together with the surface layer of the partitioning portions in order to make the phosphor thick to obtain a higher sensitivity, and also to make pixel pitches finer to enhance resolution, thus obtaining exact images without creating any cross talks between pixels.

12 Claims, 9 Drawing Sheets